(12) United States Patent
Kaushik et al.

(10) Patent No.: US 7,622,387 B2
(45) Date of Patent: Nov. 24, 2009

(54) GATE ELECTRODE SILICIDATION PROCESS

(75) Inventors: Vidya Kaushik, Hoeilaart (BE); Benoit Froment, Crolles (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/065,256

(22) PCT Filed: Aug. 29, 2005

(86) PCT No.: PCT/EP2005/010457

§ 371 (c)(1),
(2), (4) Date: Feb. 28, 2008

(87) PCT Pub. No.: WO2007/025564

PCT Pub. Date: Mar. 8, 2007

(65) Prior Publication Data

US 2008/0197498 A1   Aug. 21, 2008

(51) Int. Cl.
*H01L 21/44* (2006.01)

(52) U.S. Cl. .................. 438/682; 438/664; 257/412; 257/E29.161; 257/E21.199; 257/E21.622

(58) Field of Classification Search .......... 257/388, 257/412, 754, E29.161, E29.156, E21.199, 257/E21.438, E21.439, E21.622; 438/655, 438/664, 682, 581, 583, 630, 649, 651
See application file for complete search history.

(56) References Cited

U.S. PATENT DOCUMENTS 6,555,453 B1   4/2003   Xiang et al.

| | | |
|---|---|---|
| 2001/0003056 A1 | 6/2001 | Hashimoto et al. |
| 2002/0192932 A1* | 12/2002 | Tsai et al. ................ 438/592 |
| 2003/0143825 A1 | 7/2003 | Matsuo et al. |
| 2005/0130366 A1 | 6/2005 | Lu |
| 2005/0269635 A1* | 12/2005 | Bojarczuk et al. .......... 257/338 |

OTHER PUBLICATIONS

Zhao, Q. T., Full silicidation process for making CoSi2 on SiO2, Apr. 26, 2004, Applied Physics Letters, vol. 84 No. 17, pp. 3292-3293.*
Zhang et al; "Self-Aligned Silicides for Ohmic Contacts in Complimentary Metal -Oxide-Semiconductor technology: TiSi2, CoSi2, and NiSi"; 2004 Journal of Vacuum Science and Technology.
Kedzierski et al; "Threshold Voltage Control in NiSi-gated MosFets Through SiiS"; 2005 IEEE Transactions on Electron Devices.
Wen et al; "Effect of Ni Thickness Dependence on NiSi FUSI Metal Gate Characteristics"; 2004 Electrochemical and Solid-State Letters.
Takahashi et al; "Dual Workfunction Ni-Silicide/HfSiON Gate Stacks by Phase-Controlled Full-Sificidation (PC-FUSI) Technique fro 45nm-node LSTP and LOP Devices"; 2004 IEDM Devices Meeting.
Zhao et al; "Full Silicidation Process for Making CoSi2 on SiO2"; 2004 Applied Physics Letters.

* cited by examiner

*Primary Examiner*—Minh-Loan T Tran
*Assistant Examiner*—Yu-Hsi Sun

(57) ABSTRACT

A fully-silicided gate electrode is formed from silicon and a metal by depositing at least two layers of silicon with the metal layer therebetween. One of the silicon layers may be amorphous silicon whereas the other silicon layer may be polycrystalline silicon. The silicon between the metal layer and the gate dielectric may be deposited in two layers having different crystallinities. This process enables greater control to be exercised over the phase of the silicide resulting from this silicidation process.

9 Claims, 6 Drawing Sheets

GATE ELECTRODE SILICIDATION PROCESS

The present invention relates to the field of semiconductor device manufacture. More particularly, the invention relates to the fabrication of a fully-silicided gate electrode.

Recently, interest has been shown in replacing conventional gate electrodes by fully-silicided ("FUSI") or totally-silicided ("TOSI") gate electrodes, as a way of enabling further scaling down of the size of integrated circuit devices. However, a number of problems arise when conventional methods are used for fabricating a FUSI gate electrode.

Consider the case where it is desired to manufacture a CMOS device comprising an NMOS transistor and PMOS transistor both having FUSI gate electrodes. FIG. 1 illustrates the main steps in a conventional method for fabricating such a device.

As shown in FIG. 1A, an isolation structure 12, such as a shallow trench isolation structure (STI), is formed in a silicon substrate 10 so as to isolate active device regions from each other. A gate dielectric layer, 20, such as silicon oxide, is formed over the silicon substrate 10 and then a thin film of polycrystalline Si (poly-Si) 30 is deposited over this gate dielectric layer 20. Typically the poly-Si film 30 will be around 30 nm (300 Å) thick.

Next, that region of the poly-Si film 30 which will eventually constitute the gate of the NMOS transistor is doped with a P-type impurity such as arsenic, As. This is achieved by forming a layer of photoresist 35 over the region corresponding to the PMOS transistor and exposing the remainder of the poly-Si layer 30 to bombardment by As ions, as illustrated in FIG. 1B.

Next, that region of the poly-Si film 30 which will eventually constitute the gate of the PMOS transistor is doped with an N-type impurity such as boron, B. This is achieved by forming a layer of photoresist 36 over the region corresponding to the NMOS transistor and exposing the remainder of the poly-Si film 30 to bombardment by B ions, as illustrated in FIG. 1C.

As illustrated in FIG. 1D, a hardmask, 40, is then formed over the whole surface. Typically this hardmask 40 may be an oxide, or could be another suitable material, e.g. SiN, SiON, etc. Next the gate dielectric, poly-Si and hardmask layers 10-30 are patterned to form gate structures 50, as illustrated in FIG. 1E. A pre-spacer oxide layer, or liner, 51 is deposited over the top and sidewalls of the gate, extending a little way onto the substrate 10. Spacers, 52, are then formed on the sidewalls of the gate structures 50 over the oxide liner 51, as shown in FIG. 1F. The spacers 52 are typically made of SiN or SiON and are formed, for example, by depositing a conformal insulating layer over the substrate and then anisotropically etching that layer.

The gate structures 50 and spacers 52 are then used as masks for the formation of the source and drain regions 15 of the NMOS and PMOS transistors, for example by an ion implantation process, yielding the structure illustrated in FIG. 1F. Next a selective epitaxial growth process is used to form raised silicon drain and source regions, 16, as illustrated in FIG. 1G. Epitaxial silicon is not grown on the poly-Si gate electrode layer 30 because of the hardmask layer 40.

At this point the hardmask 40 is stripped off and a layer 55 of a metal, such as Ni, Ti, W or Co, is formed over the substrate, as illustrated in FIG. 1H. An annealing process is then performed involving, for example, a first rapid thermal anneal (RTA) step at 320° C. for 90 s followed by a second RTA step at 450° C. for 30 s—the precise combination of temperatures and durations depending upon the thickness of the layers in the gate stack, as is well-known. This causes the metal to react with the silicon, by interdiffusion of silicon and metal, and form a resulting silicide. For example, in the case of the nickel silicide, the nickel is the only diffusing specie. Thus nickel can diffuse into the raised source and drain regions 16, and into the poly-Si film 30 of the gate structures 50. Excess metal is removed, for example by a wet etching method (which may, for example, use a HCl/$H_2O_2$/$H_2O$ solution); resulting in the overall structure illustrated in FIG. 1I. In the final structure, there is a silicided gate electrode region 58 and there are also thick silicided areas 18 in the raised source/drain 16 as well as extending a certain depth into the source/drain regions 15 in the substrate.

FIG. 2 illustrates how the structure of the gate electrode region changes as the above-described conventional silicidation process progresses. The stacked structure at the left of FIG. 2 indicates the initial structure when the silicidation process begins and the subsequent stacked structures, running across in the direction from left to right of the figure, show how that initial structure changes as silicidation progresses. In the example illustrated in FIG. 2, the refractory metal deposited on the poly-Si of the gate structure is Ni.

As shown in FIG. 2, initially the gate dielectric 20 carries a portion of poly-Si film 30 topped with a relatively thinner portion of a Ni layer 55. As the conventional silicidation process gets underway, a disilicide phase $Ni_2Si$ forms at the interface between the poly-Si and the overlying Ni. As the silicidation progresses, there is sequential, diffusion-limited growth of the disilicide phase. Eventually all of the Ni is converted to the $Ni_2Si$ (disilicide) phase, as illustrated in FIG. 2 in the third stack from the left (this state may correspond to the situation at the end of the first RTA process). What happens next as the annealing processes continue depends upon the ratio of Ni to Si in the gate stack. According to the literature in this field, if the ratio of Ni to poly-Si is precisely equal to 0.6 then the gate electrode, after silicidation, will consist of the NiSi phase from top to bottom, this monosilicide being the phase that is generally desired (a Ni/Si ratio of 1.2 would result in a $Ni_2Si$ phase throughout, and a 1.7 ratio would result in a $Ni_3Si$ phase throughout).

If there is far too much Ni relative to the underlying poly-Si film, then the whole of the poly-Si film becomes converted to the $Ni_2Si$ (disilicide) phase and/or other Ni-rich phases such as $Ni_3Si$ and others depending on the initial ratio between the thickness of the nickel layer deposited and the poly-Si thickness; a high ratio leading to formation of the richest Nickel-rich phases. This situation is indicated at the bottom right of FIG. 2 (labelled D). If the Ni/Si ratio is somewhat lower than this, then a NiSi (silicide or "monosilicide") phase will form at the interface between the $Ni_2Si$ phase and the poly-Si. If the Ni/Si ratio is still a little above the ideal value, e.g. there is 60 nm Ni to 100 nm Si, then although the NiSi phase will eventually extend all the way down to the gate dielectric, a layer of $Ni_2Si$ will still remain at the top of the gate stack (see the gate stack labelled C at the right of FIG. 2). It is well known that the phases that will eventually form are dependent also on the thermal budget and annealing conditions provided due to a combination of thermodynamics and reaction kinetics.

If the Ni/Si ratio is precisely correct (e.g. 60 nm Ni to 100 nm Si) then the whole gate stack will become converted to the desired NiSi phase—leading to a gate electrode that is made entirely of NiSi, in contact with the gate dielectric. This situation is illustrated at the right of FIG. 2, see the stack labelled B.

On the other hand, if the ratio of Ni/Si is too low (in other words, there is too little Ni) then the silicidation will be incomplete, in other words a thin layer of poly-Si will remain at the bottom of the gate stack (see top right of FIG. 2, the stack labelled A). This is undesirable as it leads to poly-depletion effects.

The above-described conventional silicication process generally results in a device having high gate sheet resistance. Moreover, this known process has a number of other disadvantages, including the following.

a) Although it is desirable for the gate electrode to be fully silicided, it is only desired to have a thin silicide layer at the source and drain regions, to serve as a contact. According to the conventional process, if the gate electrode is fully silicided then the source and drain regions have thick silicide layers and, thus, there is a risk of high junction leakage. More particularly, it becomes necessary to use an elevated ("raised") source and drain, which complicates the fabrication process.

b) Work function and resistivity considerations make it desirable to ensure that there is a particular silicide phase at the bottom of the gate stack, that is, at the interface with the gate dielectric. In particular, in the case where the metal used for siliciding the gate electrode is Ni, the desired phase is the NiSi phase.

This can be understood from a consideration of the work function obtainable at different gate dopings when different silicide phases are in contact with the gate dielectric. It has been found that a desired work function modulation cannot be obtained when $Ni_2Si$ is in contact with the gate dielectric, but can be obtained using NiSi as the silicide phase in contact with the gate dielectric. Moreover, NiSi has lower resistivity than $Ni_2Si$.

However, in the conventional silicidation process it is difficult to control the phase that will be present at the interface with the gate dielectric; this depends on the precise ratio of thicknesses of the poly-Si and metal layers at the time when the silicidation process begins. Moreover, process fluctuations and interface roughness can cause a variation in the phase resulting from the silicidation process.

In order to avoid the situation where, at the end of the silicidation process, there is unreacted Si at the interface with the gate dielectric, it is common to increase the amount of metal above the nominally-desired amount. Thus, typically, there will be an undesired silicide phase at the top of the gate stack and, in some cases, there may be grains of an undesired phase in contact with the gate dielectric.

c) A particular problem can arise in the case where the conventional silicidation process is used to form a FUSI gate having a short line width. This problem can be better understood from a consideration of FIG. 3. Once again, FIG. 3 relates to an example in which Ni is used as the metal for forming the FUSI gate.

During the silicidation process, it is not just the metal that directly overlies the poly-Si layer that contributes to the conversion of that poly-Si to a metal silicide; metal lying over the spacers, 52, also contributes to this silicidation process. When the FUSI gate electrode being formed has a relatively large line width, as in the example of FIG. 3A, the extra Ni contributed from over the spacers can lead to the presence of a $Ni_2Si$ phase at the top of the gate electrode. Nevertheless, if the line width is great enough, a desired NiSi phase will still be present at the interface with the gate dielectric. However, as the line width reduces, a dual phase ($Ni_2Si$/NiSi) can be present at the interface with the gate dielectric. Moreover, when the FUSI gate electrode being formed has a particularly small line width, as in the example of FIG. 3B, the extra Ni contributed from over the spacers can lead to the situation where the less-desirable $Ni_2Si$ phase is in contact with the gate dielectric. This disadvantageous effect leads to a shift in threshold voltage, Vt, and has been observed for line-widths less than 100 nm.

One approach that has been proposed in order to address above-described problem a), is to thin the poly-Si layer that is to be converted to a FUSI gate electrode. This would reduce the amount of time required for full silicidation of the gate electrode and, thus, reduce the depth of silicidation at the drain and source regions. However, when the gate poly-Si is thinned, it becomes even more difficult to ensure that the correct ratio of metal to poly-Si is respected. In other words, it becomes even more difficult to control the silicide phase that will end up in contact with the gate dielectric layer. Moreover, above-described problem c) becomes more acute, in other words the contribution of metal from over the spacers becomes more significant.

One approach that has been tried in order to address above-described problem b), in other words, in order to control the silicide phase that ends up being in contact with the gate dielectric layer, is to implement the silicidation process so that it includes a first annealing step, in which the annealing conditions are set so as to produce a disilicide phase, and then to perform a second annealing step (possibly after adding extra refractory metal), in which annealing conditions are set so as to convert the disilicide phase to a monosilicide phase. However, this approach has the disadvantage that it does not solve the problem of shorter gates tending to have Ni-rich silicides. Moreover, if there is significant roughness at the interface between the different phases in the stack, the phase distribution and control can be affected at the oxide interface, as will be explained below.

It is desirable to develop a new silicidation process that can overcome or avoid the above-discussed problems and, in particular, can provide a desired metal silicide phase at the end of the silicidation process.

The preferred embodiments of the present invention provide a method of fabricating a fully-silicided layer such that the phase of the fully-silicided layer can be better controlled.

The present invention provides a method of fabricating a fully-silicided gate electrode layer as set forth in the accompanying claims.

The present invention provides a fully-silicided gate electrode as set forth in the accompanying claims.

Features and advantages of the present invention will become clear from the following description of preferred embodiments thereof, given by way of example, illustrated by the accompanying drawings, in which:

FIG. 1 illustrates a conventional silicidation process, in which

FIG. 4 illustrates a silicidation process according to a first preferred embodiment of the present invention, in which FIG. 5 illustrates a silicidation process according to a variant of the first preferred embodiment of the present invention, in which

In the conventional silicidation process, a metal reacts with silicon to form a silicide and, especially at low line widths, it can be difficult to control the phase that will be present at the gate dielectric after the silicidation process has terminated.

Existing proposals attempt to exert phase control by controlling the supply of metal. In general, phase control is made difficult because of the presence of a greater-than-required amount of metal in the stack of layers that is to be converted to metal silicide.

New silicidation processes according to preferred embodiments of the invention will now be described in which the silicon to be converted into metal silicide is deposited in at least two stages. In these preferred embodiments, it is the availability of silicon that is being controlled in the silicidation process and, in particular, these methods involve controlling the crystallinity of the silicon and/or the location of the silicon relative to the metal.

A first preferred embodiment of the invention will now be described with reference to FIG. 4. A variant of the first preferred embodiment will then be described with reference to FIG. 5.

FIGS. 4 and 5 illustrate methods of fabricating a CMOS device including NMOS and PMOS transistors each having FUSI gate electrodes made of NiSi. However, it is to be understood that the silicidation process of the preferred embodiments of the invention can be applied more generally to the creation of a fully-silicided layer of a metal silicide other than Ni (e.g. CoSi, TiSi, WSi, etc.).

The fabrication process according to the first preferred embodiment of the invention shall be described first. In this embodiment, there is control over the amount of silicon that is provided for the silicidation process. More particularly, the nickel to be converted into a silicide is sandwiched between two layers of silicon.

In the first stage of the process according to the first preferred embodiment of the invention, a device isolation region 112 is formed in a silicon substrate or the like (e.g. a silicon-on-insulator (SOI) substrate) 110 in order to separate the regions that, in the final device, will correspond to the NMOS transistor and PMOS transistor, respectively. This device isolation region 112 can be any suitable structure, e.g. a shallow trench isolation structure (STI), formed using conventional techniques. A gate dielectric layer, 120, such as silicon oxide, is formed over the silicon substrate 110 using known processes.

Figure 4A:
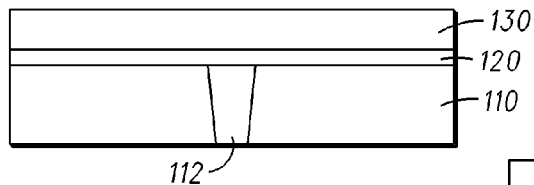
FIGS. 4A to 4J illustrate successive steps in the process.

Next, as indicated in FIG. 4A, a layer of silicon 130 is deposited over the gate dielectric layer 120. This silicon layer 130 may be a poly-Si layer or an amorphous silicon layer as shall be described below, and may be formed with a thickness of from about 30 nm to about 200 nm (300 to 2000 Å). Conventional tools used for depositing polycrystalline silicon can be used to deposit the silicon layer 130.

Figure 4B:
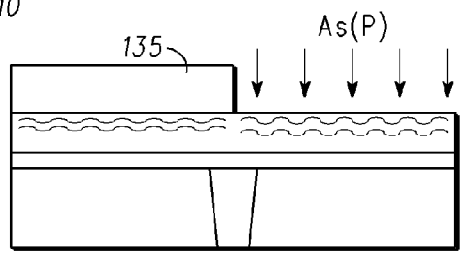
Figure 4C:
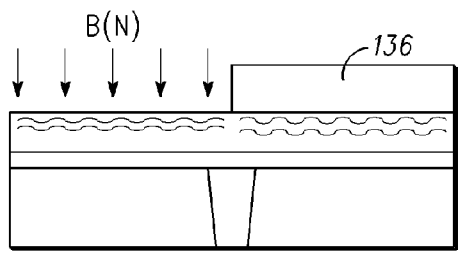
Figure 4D:
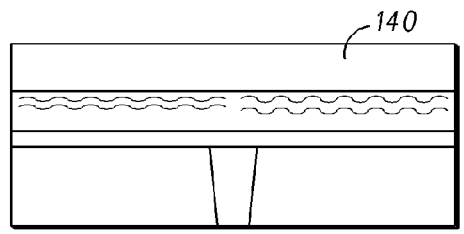
Figure 4E:
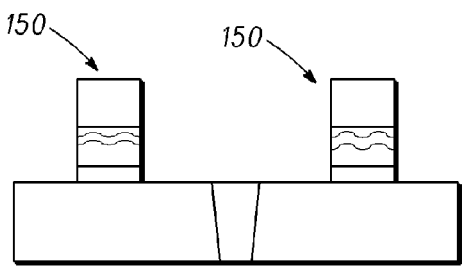
Figure 4F:
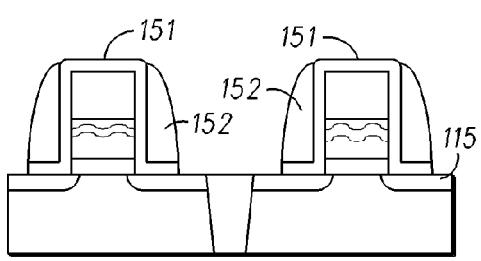

Once the silicon layer 130 has been deposited, the desired ion implantation into the NMOS and PMOS regions is performed using photoresist layers 135 and 136 for masking (as illustrated in FIGS. 4B and 4C), a hardmask 140 made of, for example, SiO$_2$, SiN or TiN, is formed over the silicon layers 130 (see FIG. 5D), the gates 150 are patterned (see FIG. 4E), pre-spacer oxide 151 is formed over the gate, hard mask remnant and a portion of the substrate, then nitride spacers 152 are formed on the gate sidewalls and impurities are implanted into the source and drain regions 115 of the silicon substrate (see FIG. 4F). The processes and materials used in implementing the steps illustrated in FIGS. 4B to 4F may be conventional processes, for example as described above with reference to FIGS. 1B to 1F. Accordingly, no detailed description of these steps will be given here.

Figure 4G:
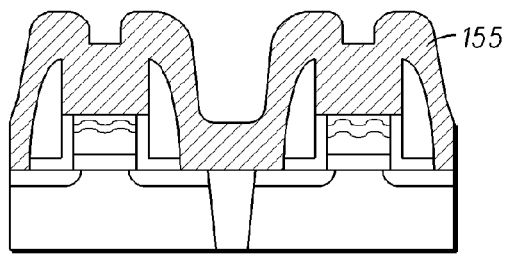
Figure 4H:
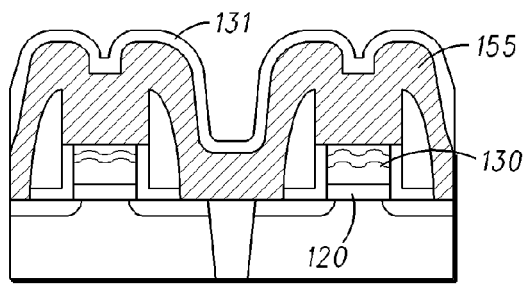
Figure 4I:
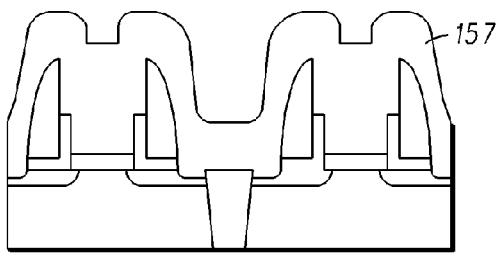

After the spacers, 152, have been formed on the gate electrode sidewalls, the hardmask 140 and top portion of the pre-spacer oxide 151 is stripped from the gate electrode regions, for example using conventional techniques. Next, a nickel layer 155 is deposited over the substrate, for example using an evaporation process or sputtering process, as illustrated in FIG. 4G. An additional silicon layer 131 is deposited over the nickel layer 155, as illustrated in FIG. 4H. Preferably this additional silicon layer 131 is formed using a low temperature deposition process (i.e. a deposition process performed below silicidation temperatures), such as PVD, sputtering or low temperature CVD.

The thickness of the additional silicon layer 131 depends on the dimensions of the other layers in the overall stack. For example, in a case where the first silicon layer 130 is a 30 nm poly-Si layer, and the Ni layer 155 has a thickness of 20 nm to 24 nm, and the gate electrode being fabricated has a width of from 32 nm upwards, a suitable value of the thickness of the additional silicon layer 131 could be, for example, 10 nm.

When suitable annealing conditions (e.g. a first rapid thermal anneal at 320° C. for 90 seconds and a second rapid thermal anneal at 450° C. for 30 seconds, or a first RTA at 290° C. for 90 seconds followed by a second RTA at 450° C. for 60 seconds, etc.) are applied to the structure illustrated in FIG. 4H, the nickel layer 155 and silicon layers 130 and 131 in the gate electrode region are converted into a fully-silicided layer 157 extending down to the gate dielectric (see FIG. 4I) and regions of silicide 118' are formed in shallow areas of the source and drain regions 115.

Figure 4J:
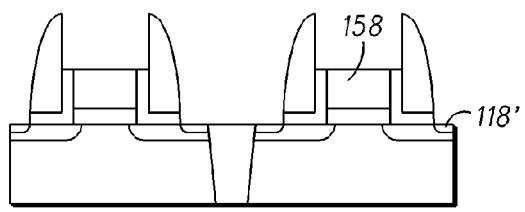

After the annealing process, excess metal silicide is removed by a wet etching process. This wet etch process may, for example, use hydrofluoric acid (HF) or cold SC2, or HF followed by a SC2. The resulting structure is illustrated in FIG. 4J and includes a fully-silicided gate electrode 158 in which the silicide phase adjacent to the gate dielectric 120 can be controlled as desired, e.g. to the monosilicide phase, NiSi.

Figure 1A:
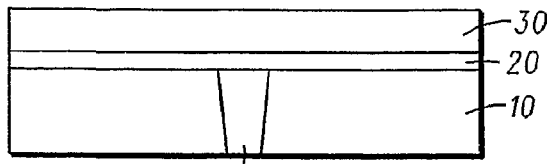
FIGS. 1A to 1I illustrate successive steps in the conventional process.
Figure 1B:
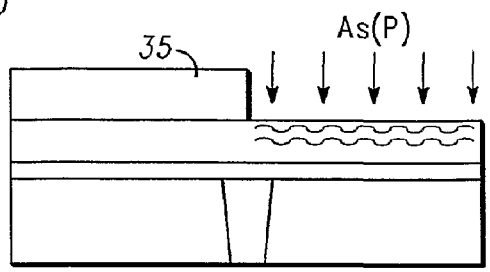
Figure 1C:
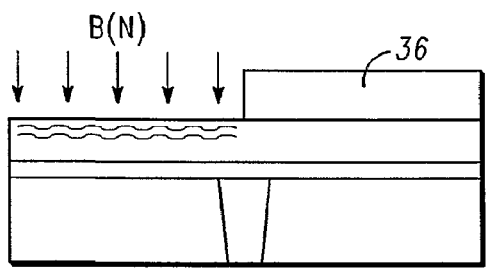
Figure 1D:
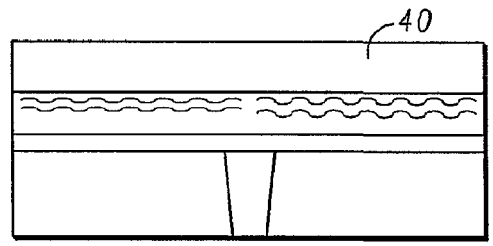
Figure 1E:
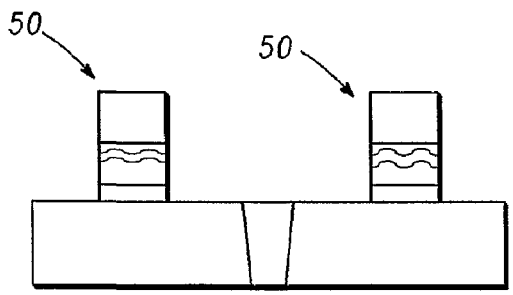
Figure 1F:
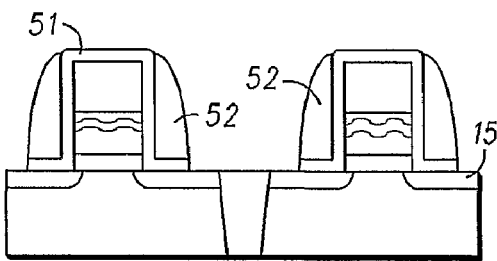
Figure 1G:
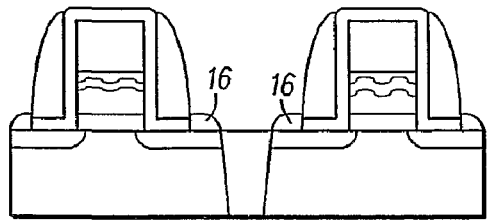
Figure 1H:
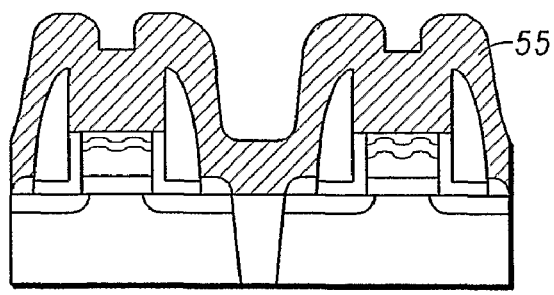
Figure 1I:
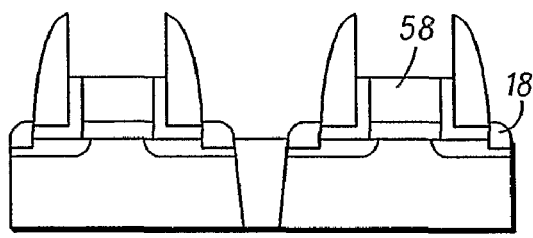
Figure 3A:
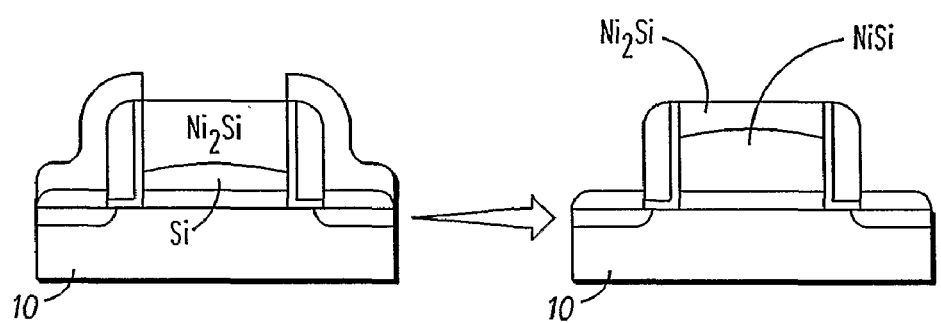
FIG. 3 is a diagram schematically representing how the silicide phase of a gate electrode varies with line width, when a conventional silicidation process is used.
Figure 3B:
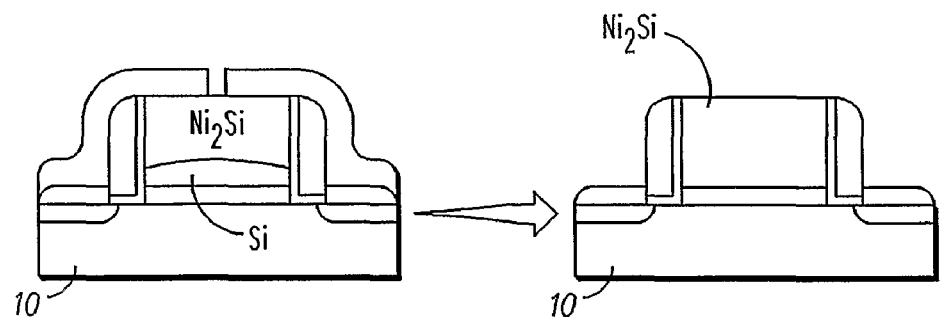
Figure 2:
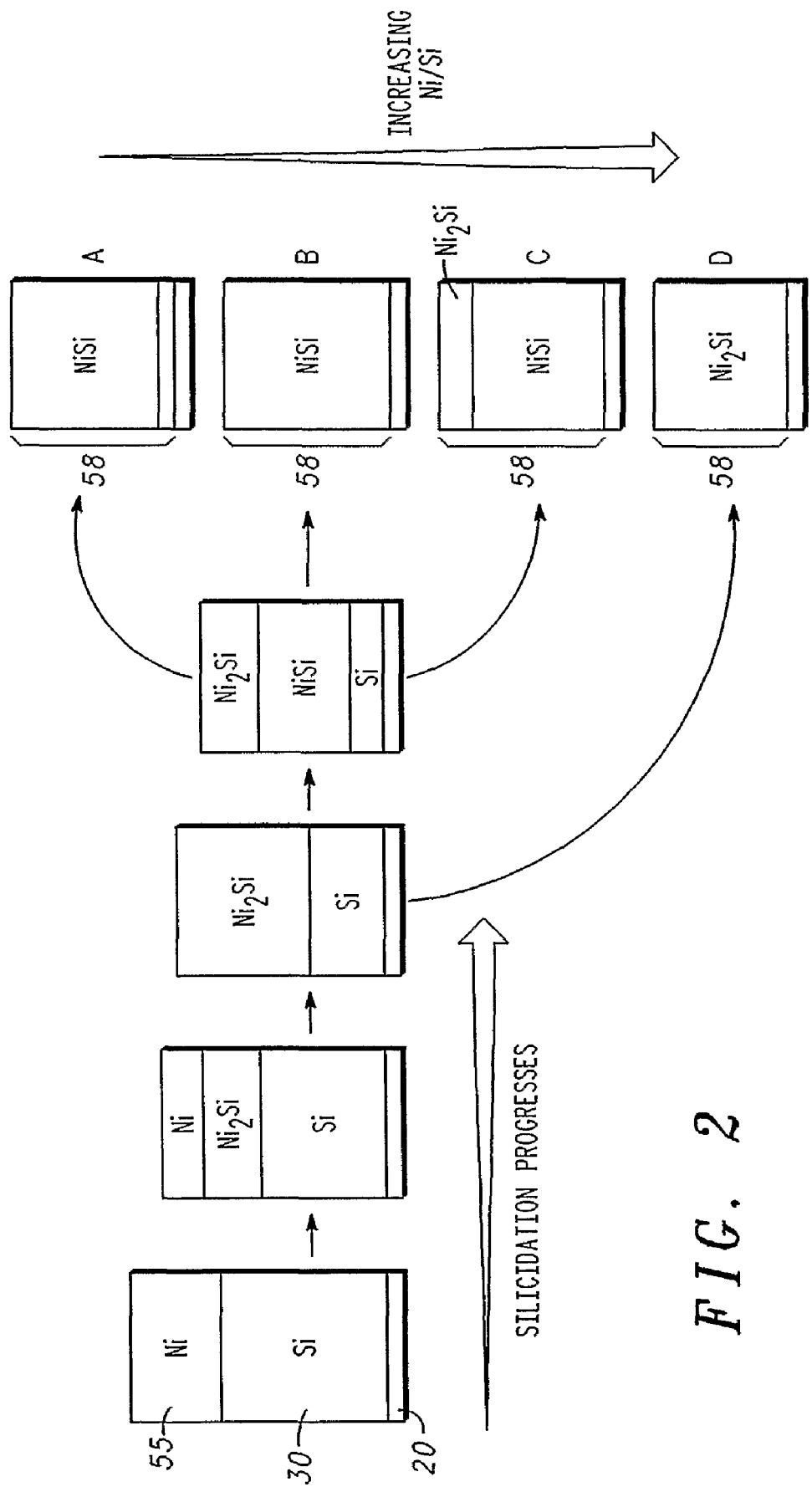
FIG. 2 is a diagram schematically representing how the structure of a poly-Si/refractory metal stack changes during a conventional silicidation process.

The presence of the additional silicon layer 131 ensures that, during the silicidation process, there is sufficient silicon available to ensure transformation of the initially-formed Ni$_2$Si phase such that, at the end of the silicidation process, it is the monosilicide phase, NiSi, which is in contact with the gate dielectric layer 120, even in the case where metal is contributed from over the spacers (which can happen when gate lengths are small, as described above with reference to FIG. 3).

Thus, the additional silicon layer 131 enables better control of the silicide phase that will be in contact with the gate dielectric after silicidation, enabling a desired work function and threshold voltage to be obtained in the finished device. Moreover, it has been found that the presence of the additional silicon layer 131 also leads to lower roughness of the interfaces between the various phases in the gate stack which, in turn, helps avoid the situation where grains of an undesired phase contact the gate dielectric.

With the silicidation method according to the first preferred embodiment of the invention, a first silicon layer is formed, the metal layer is deposited thereon and then an additional silicon layer is formed on the metal layer. The respective thicknesses of the two silicon layers and the metal layer are chosen to give full silicidation at desired RTA temperatures.

If the summed thickness of the silicon layers 130 and 131 at the gate stack is designated Th$_{sum}$, and the thickness of the nickel layer 155 at the gate stack is designated Th$_{Ni}$, it is advantageous for the ratio Th$_{sum}$/Th$_{Ni}$ to be from about 0.85 to about 1.6. Preferably the thickness of the lower silicon layer 130 at the gate stack is from about 10 nm to about 40 nm. The distribution of thickness between the lower silicon layer 130 and the upper silicon layer 131 can be varied. Typically, the thickness of the upper silicon layer 131 at the gate stack will be around a third the thickness of the lower silicon layer 130 at the gate stack.

At present it is preferred that when forming a Ni FUSI gate electrode the first silicon layer 130 should be formed of polycrystalline silicon and the additional silicon layer 131 should be formed of amorphous silicon. However, it is believed that the method according to the first preferred embodiment of the invention can be applied regardless of the crystallinity of the first and second silicon layers, for example, both the first silicon layer 130 and the additional silicon layer 131 may be formed of polycrystalline silicon.

The fabrication process according to a variant of the first preferred embodiment of the invention shall now be described with reference to FIG. 5. In this embodiment, the silicon layer closest to the gate dielectric is formed in two layers having respective different crystallinities.

In the first stage of the process according to the second preferred embodiment of the invention, a device isolation region 212 (e.g. an STI structure) is formed in a silicon substrate 210 in order to separate the regions that, in the final device, will correspond to the NMOS transistor and PMOS transistor, respectively. A gate dielectric layer, 220, such as silicon oxide, is formed over the silicon substrate 210 using known processes.

Figure 5A:
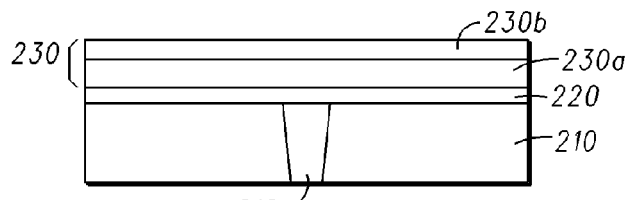
FIGS. 5A to 5J illustrate successive steps in the process.
Figure 5B:
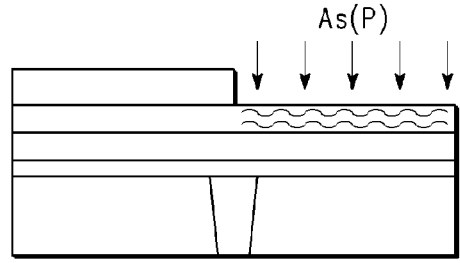
Figure 5C:
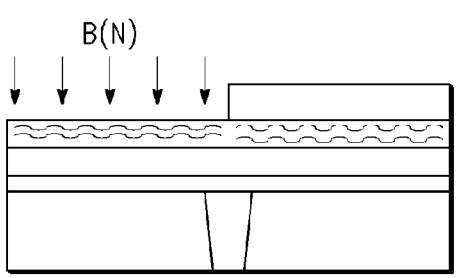
Figure 5D:
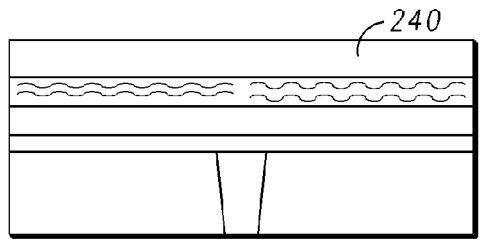
Figure 5E:
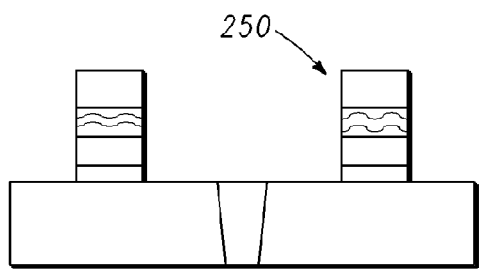
Figure 5F:
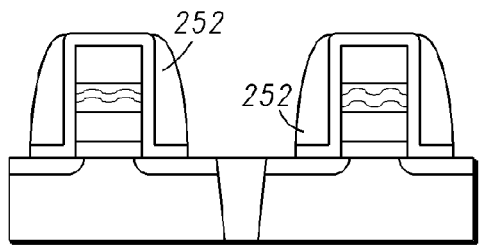

Next, as indicated in FIG. 5A, two layers of silicon 230a and 230b, having respective different crystallinities, are deposited over the gate dielectric layer 220. The first silicon layer 230a (closest to the gate dielectric) may be a polycrystalline silicon layer and the second silicon layer 230b may be an amorphous silicon (a-Si) layer. Alternatively, the first layer 230a may be an amorphous silicon layer and the second layer 230b may be a polycrystalline silicon layer.

The overall (summed) thickness of the poly-Si and a-Si layers 230 can be in the range of from about 30 nm to about 200 nm (300-2000 Å) depending upon the technology node/gate thickness (the 200 nm summed thickness value applying to older technologies, a summed thickness value of around 100 nm applying to minimum size gates between the 45 nm and 65 nm technology nodes). However, as an example, when fabricating a gate having a width from 32 nm to 10 µm, and planning to deposit a nickel layer of 15 to 20 nm thickness, the silicon layer 230a could be a 20 to 30 nm thick layer of polycrystalline silicon and the layer 230b could be a 10 nm thick layer of amorphous silicon. Conventional tools used for depositing polycrystalline silicon can be used to deposit both the poly-Si layer and the a-Si layer.

After the silicon layers 230a and 230b have been formed, the desired ion implantation, hardmask-formation, gate-patterning, pre-spacer oxide deposition, spacer-formation and impurity-implantation steps are performed, as illustrated in FIGS. 5B to 5F. These steps can be implemented in the same way as in the first preferred embodiment. Accordingly, no detailed description of these steps will be given here.

Figure 5G:
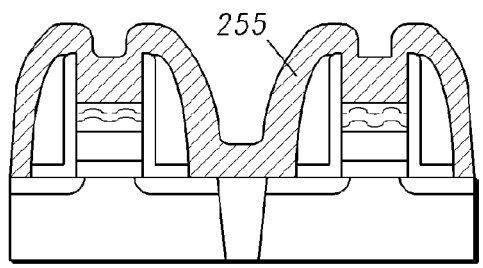
Figure 5H:
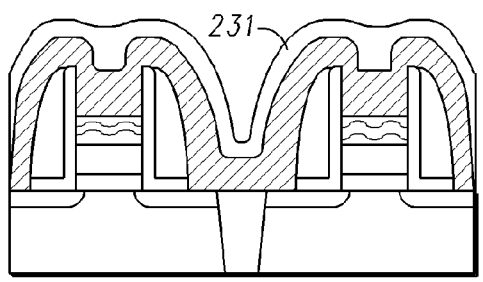
Figure 5I:
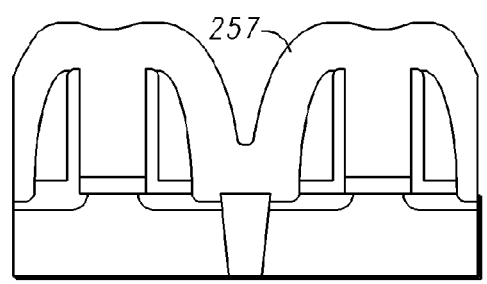
Figure 5J:
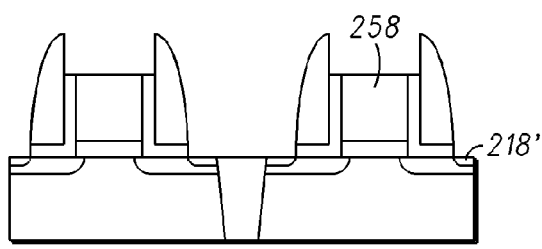

After the spacers, 252, have been formed on the gate electrode sidewalls, the hardmask 240 is stripped from the gate electrode regions, for example using conventional techniques. Next, a nickel layer 255 is deposited over the substrate, for example using an evaporation process or sputtering process, as illustrated in FIG. 5G. An additional silicon layer 231 is deposited over the nickel layer 255, as illustrated in FIG. 5H. This additional silicon layer 231 may be polycrystalline silicon or amorphous silicon.

When suitable annealing conditions are applied to the structure illustrated in FIG. 5H, the sandwich of the silicon layers 230a, 230b, nickel layer 255 and silicon layer 231 in the gate electrode region are converted into a fully-silicided layer 257 extending down to the gate dielectric (see FIG. 5I) and regions of silicide 218' are formed in shallow areas of the source and drain regions 215. The annealing conditions may be the same as the conditions described above in relation to the first preferred embodiment and typically will involve a first RTA process in the temperature range of 270 to 330° C. (inclusive) and a second RTA process performed in the temperature range 350-500° C. (inclusive). The duration of each RTA process will depend on the applied temperature and, generally, will be in the range from 30 to 120 seconds.

After the annealing process, excess metal silicide (and any unreacted portions of the silicon layer 230b and metal layer 255) are removed by a wet etching process. Once again, this wet etch process may, for example, use hydrofluoric acid (HF) and/or cold SC2. The resulting structure is illustrated in FIG. 6J and includes a fully-silicided gate electrode 258 in which the silicide phase adjacent to the gate dielectric 220 can be controlled as desired, e.g. to the monosilicide phase, NiSi.

By controlling the relative thicknesses of the two silicon layers 230a, 230b of different crystallinities, the silicidation phases and thickness can be further controlled so as to give the desired metal silicide phase at the end of the silicidation process.

In order to explain this effect in greater detail, consider the case of a conventional silicidation process in which a 24 nm Ni layer is deposited on top of a 30 nm poly-Si layer (Ni/Si ratio=0.8, i.e. >0.6 in an attempt to ensure that no unreacted Si will remain at the interface with the gate oxide after silicidation). After an initial anneal (e.g. RTA at 290° C. for 120 seconds), there will typically be 8 nm of unreacted Si in contact with the gate oxide, and 33.6 nm of $Ni_2Si$ above it. A subsequent second annealing step (e.g. RTA at 450° C. for 60 seconds) is expected to result in the formation of a 16 nm layer of NiSi at the interface with the gate oxide, topped by a 25 nm thick layer of $Ni_2Si$.

However, at the end of the first RTA step the roughness of the interface between the $Ni_2Si$ and poly-Si may be so great that some grains of $Ni_2Si$ are actually in contact the underlying gate oxide. During the second RTA process the supply of silicon to these grains of $Ni_2Si$ may be inadequate to enable them to convert to NiSi. Thus, at the end of the two-step annealing, there will still be some grains of $Ni_2Si$ in contact with the gate oxide, preventing the work function from attaining the desired value.

By way of contrast, according to the present variant of the first preferred embodiment of the invention, the presence of the two layers 130a, 130b of differing crystallinity tends to reduced the roughness of the interface between the nickel and the underlying silicon at the end of the first annealing step. This helps to ensure that it is the monosilicide phase, NiSi, which is in contact with the gate dielectric layer 120 at the end of the silicidation process. Indeed, for the example thickness values quoted above, after the silicidation process (the two annealing steps), the final gate will be composed of only 15 nm of $Ni_2Si$ on the top and approximately 36 nm of NiSi on the bottom (with "top" and "bottom" applying to the orientation represented in FIG. 5).

This effect of reducing roughness of the grain boundary between phases during the annealing stages is also observed to some extent in the above-described first embodiment of the invention.

If the summed thickness of the silicon layers 230a, 230b and 231 at the gate stack is designated $Th_{sum2}$, and the thickness of the nickel layer 155 at the gate stack is designated $Th_{Ni}$, it is advantageous for the ratio $Th_{sum2}/Th_{Ni}$ to be from about 0.85 to about 1.6. Preferably the thickness of the summed lower silicon layers 230a and 230b at the gate stack is from about 10 nm to about 40 nm. The partitioning of thickness between the lower silicon layers 230a/230b and the upper silicon layer 131 can be varied. Typically, the thickness of the upper silicon layer 231 at the gate stack will be around a third the summed thickness of the lower silicon layers 230a and 230b at the gate stack. The thicknesses of the first and second lower layers, 230a and 230b, relative to each other are not particularly limited; for example, if the summed thickness is to be 30 nm, the thickness of each of the layers 230a and 230b could be set to 15 nm.

The silicidation process according to the preferred embodiments of the present invention provides a number of advantages, including the following:

- the contribution of excess refractory metal (e.g. from over the spacers) becomes less important, thus enabling a desired metal silicide phase to be obtained even at lower line widths—specifically the presence of a dual monosilicide/disilicide phase at the interface with the gate dielectric can be avoided;
- because this process offers better control of the phase (disilicide/monosilicide/poly-Si) that is at the interface with the gate dielectric, a desired resistivity can be obtained as well as a desired, and uniform, (gate) work function at the interface, and more uniform work function between different devices fabricated on the same substrate,
- this process enables fabrication of a CMOS transistor with high-K and metal gates, having adequate modulation even for narrow line widths, using a simple procedure,
- this process provides adequate control of phase (and Vt) in devices having FUSI gates and small line widths, thus making FUSI gates candidates for use as metal gates when integration is scaled down to the 65 nm node and below (45 nm etc), and
- no new tools or complicated development is needed in order to implement the new process (for example, the step of depositing poly-Si and a-Si can be performed using deposition tools that are already used in fabrication plants, the step of removing excess metal can use conventional wet etching procedures, etc.).

A NiSi FUSI gate electrode produced using a method according to the present invention will be objectively different from a NiSi FUSI gate electrode formed by conventional processes. For example, a NiSi gate electrode formed using conventional methods will have a Kirkendall voiding zone, composed of NiSiOx, above the NiSi phase. Traditionally, this NiSiOx layer is attacked and removed using HF or $SC_2$ etching. Cross-section Transmission Electron Microscopy (XTEM) imaging of the final gate electrode structure produces results which show that this NiSiOx layer has been present and then removed. By way of contrast, the methods according to the present invention do not produce such a Kirkendall voiding zone above the NiSi phase.

Although the invention has been described above with reference to preferred embodiments thereof, the skilled person will readily understand that the present invention is not limited by the particularities of the above-described embodiments. More particularly, changes and developments may be made to the above-described preferred embodiments without departing from the scope of the present invention as defined in the accompanying claims.

For example, although the above-described preferred embodiments refer to specific combinations of annealing temperatures and durations, the skilled person will readily appreciate from his general knowledge how the precise annealing conditions should be varied depending on the properties (e.g. thickness of the gate stack) of the gate electrode under construction.

The invention claimed is:

1. A method of fabricating a fully-silicided gate electrode layer comprising a predetermined silicide phase located at a first surface of the gate electrode layer, the method comprising:
    forming at least one first layer of silicon;
    forming a metal layer of a non-silicided metal;
    forming an additional layer of silicon such that the metal layer is between the first layer(s) of silicon and the additional layer of silicon; and
    simultaneously applying heat to the superposed first silicon layer(s), metal layer and additional silicon layer to convert said first silicon layer, said metal layer and said additional layer of silicon into a metal silicide having a predetermined metal silicide phase at a first surface thereof, said first surface being arranged for contacting a gate insulator.

2. A method of fabricating a fully-silicided gate electrode layer according to claim 1, wherein said forming at least one first layer of silicon comprises forming a layer of polycrystalline silicon and said forming an additional layer of silicon comprises forming a layer of amorphous silicon.

3. A method of fabricating a fully-silicided gate electrode layer according to claim 2, and comprising controlling the relative thicknesses of said metal layer and of said first and additional layers of silicon in order to control the phase of the metal silicide layer at said first surface that is formed during the heat-application.

4. A method of fabricating a fully-silicided gate electrode layer according to claim 2, wherein said forming at least one first layer of silicon comprises forming at least two silicon layers having respective different crystallinities.

5. A method of fabricating a fully-silicided gate electrode layer according to claim 1, comprising: controlling the relative thicknesses of said metal layer and of said first and additional layers of silicon in order to control the phase of the metal silicide layer at said first surface that is formed during the heat-application.

6. A method of fabricating a fully-silicided gate electrode layer according to claim 5, wherein said forming at least one first layer of silicon comprises forming at least two silicon layers having respective different crystallinities.

7. A method of fabricating a fully-silicided gate electrode layer according to claim 1, wherein said forming at least one first layer of silicon comprises forming at least two silicon layers having respective different crystallinities.

8. A method as claimed in claim 1, wherein said forming at least one first layer of silicon comprises forming a layer of polycrystalline silicon and said forming an additional layer of silicon comprises forming a layer of polycrystalline silicon.

9. A method as claimed in claim 1, wherein said simultaneously applying heat to the superposed first silicon layer(s), metal layer and additional silicon layer comprises a first anneal and a second anneal.

* * * * *